United States Patent
Yazawa et al.

(10) Patent No.: US 12,123,798 B2
(45) Date of Patent: Oct. 22, 2024

(54) PRESSURE SENSOR

(71) Applicant: Alps Alpine Co., Ltd., Tokyo (JP)

(72) Inventors: Hisayuki Yazawa, Niigata-ken (JP);
Hisanobu Okawa, Niigata-ken (JP);
Masahiko Ishizone, Niigata-ken (JP);
Toru Takahashi, Niigata-ken (JP);
Ayako Otsuka, Niigata-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 674 days.

(21) Appl. No.: 17/411,406

(22) Filed: Aug. 25, 2021

(65) Prior Publication Data

US 2021/0381918 A1     Dec. 9, 2021

Related U.S. Application Data

(63) Continuation of application No. PCT/JP2020/007236, filed on Feb. 21, 2020.

(30) Foreign Application Priority Data

Feb. 28, 2019    (JP) ................. 2019-036554

(51) Int. Cl.
*G01L 9/08*     (2006.01)
*H10N 30/30*     (2023.01)
*H10N 30/80*     (2023.01)

(52) U.S. Cl.
CPC ............ *G01L 9/08* (2013.01); *H10N 30/302* (2023.02); *H10N 30/802* (2023.02)

(58) Field of Classification Search
CPC ...... H10N 30/302; H10N 30/802; G01L 9/08; G01L 9/0052; G01L 9/0042
See application file for complete search history.

(56) References Cited

U.S. PATENT DOCUMENTS

| | | |
|---|---|---|
| 6,006,607 A | 12/1999 | Bryzek et al. |
| 2002/0100948 A1 | 8/2002 | Yoshihara et al. |

(Continued)

FOREIGN PATENT DOCUMENTS

| | | |
|---|---|---|
| EP | 0736756 | 10/1996 |
| JP | 8-279621 | 10/1996 |

(Continued)

OTHER PUBLICATIONS

English translation of JP 2009-551527 (Year: 2009).*
International Search Report from corresponding International Application No. PCT/JP2020/007236, 2 pp., Mar. 17, 2020.

*Primary Examiner* — Emily P Pham
(74) *Attorney, Agent, or Firm* — Crowell & Moring LLP

(57) ABSTRACT

A pressure sensor includes a diaphragm on a silicon substrate and a plurality of piezoelectric element areas that change in resistance according the distortion of the diaphragm. The plurality of piezoelectric element areas of the pressure sensor include a first piezoelectric element area, a second piezoelectric element area, a third piezoelectric element area, and a fourth piezoelectric element area. The diaphragm has a maximum deflection area whose stress becomes 80% or more of a maximum stress when distorted by a predetermined pressure. The first piezoelectric element area, the second piezoelectric element area, the third piezoelectric element area, and the fourth piezoelectric element area are disposed in the maximum deflection area.

10 Claims, 10 Drawing Sheets

(56) References Cited

U.S. PATENT DOCUMENTS

| | | | |
|---|---|---|---|
| 2007/0152679 A1 | 7/2007 | Kurtz et al. | |
| 2011/0308323 A1 | 12/2011 | Oizumi | |
| 2013/0145853 A1 | 6/2013 | Donzier et al. | |

FOREIGN PATENT DOCUMENTS

| | | | |
|---|---|---|---|
| JP | 2000-214027 | 8/2000 | |
| JP | 2002-373991 | 12/2002 | |
| JP | 2006-3099 | 1/2006 | |
| JP | 4-328434 | 9/2009 | |
| JP | 2012-002646 | 1/2012 | |
| JP | 2015-179000 | 10/2015 | |
| WO | WO-2009096407 A1 * | 8/2009 | ........... G01L 9/0054 |

\* cited by examiner

PRESSURE SENSOR

CLAIM OF PRIORITY

This application is a Continuation of International Application No. PCT/JP2020/007236 filed on Feb. 21, 2020, which claims benefit of Japanese Patent Application No. 2019-036554 filed on Feb. 28, 2019. The entire contents of each application noted above are hereby incorporated by reference.

BACKGROUND

1. Field of the Disclosure

The present disclosure relates to pressure sensors, and in particular, to a pressure sensor including a plurality of piezoelectric elements the resistance of which changes according to the distortion of a diaphragm.

2. Description of the Related Art

Known pressure sensors include a diaphragm formed using, for example, the technique of a micro electro mechanical system (MEMS), in which piezoelectric elements whose resistance changes according to distortion.

Japanese Unexamined Patent Application Publication No. 2000-214027 discloses a semiconductor pressure sensor with improved pressure detection sensitivity. The piezoresistive elements of this semiconductor pressure sensor are shaped so that many parts of the piezoresistive elements are disposed in an area in which great stress is generated when the diaphragm is deformed.

Japanese Unexamined Patent Application Publication No. 2015-179000 discloses a physical quantity sensor with high detection accuracy. In this physical quantity sensor, piezoresistive portions are disposed around the outer edge of a diaphragm where a lot of stress is applied to increase changes in the resistance of the piezoresistive elements, thereby increasing the change in the output of the bridge circuit.

Japanese Unexamined Patent Application Publication No. 2012-002646 discloses a semiconductor pressure sensor in which an influence due to displacement of the relative position between the diaphragm and the sensitive resistive elements is small. In this semiconductor pressure sensor, the areas and the outer shapes of the piezoresistive element disposed regions of each piezoresistive portion are set to be the same to reduce energization fluctuation due to the thermal fluctuation of the piezoresistive elements.

A pressure sensor that uses a diaphragm and piezoelectric elements constitutes a bridge circuit with four piezoelectric elements and measures output (pressure) on the basis of resistance that changes according to the distortion of the diaphragm. The relationship between the distribution of stress due to the deflection of the diaphragm and the layout of the four piezoelectric elements therefore significantly influences variations in the output of the bridge circuit and the generation of high-order nonlinear components contained in the output of the pressure sensor.

SUMMARY

The present invention provides a pressure sensor using a diaphragm and piezoelectric elements capable of high output with high accuracy.

A pressure sensor according to an aspect of the disclosure includes a diaphragm on a silicon substrate and a plurality of piezoelectric element areas that change in resistance according to distortion of the diaphragm. In the pressure sensor, the plurality of piezoelectric element areas include a first piezoelectric element area, a second piezoelectric element area, a third piezoelectric element area, and a fourth piezoelectric element area. The first piezoelectric element area and the second piezoelectric element area are connected in series via a first output terminal. The third piezoelectric element area and the fourth piezoelectric element area are connected in series via a second output terminal. The first piezoelectric element area and the third piezoelectric element area are connected via an input terminal. The second piezoelectric element area and the fourth piezoelectric element area are connected via a grounding terminal. The first piezoelectric element area to the fourth piezoelectric element area constitute a full bridge circuit. When the diaphragm is distorted, the resistance of the second piezoelectric element area and the third piezoelectric element area increases, and the resistance of the first piezoelectric element area and the fourth piezoelectric element area decreases. The diaphragm has a maximum deflection area whose stress becomes 80% or more of a maximum stress when distorted by a predetermined pressure. The first piezoelectric element area, the second piezoelectric element area, the third piezoelectric element area, and the fourth piezoelectric element area are disposed in the maximum deflection area.

With this configuration, each of the plurality of piezoelectric element areas is disposed in the maximum deflection area of the diaphragm. This allows the stress due to the distortion of the diaphragm to be received by the piezoelectric element areas sufficiently and evenly. This reduces higher-order nonlinear components in the output of the pressure sensor to maximize the output voltage of the bridge circuit without changing the overall configuration (the size, thickness, and so on of the diaphragm).

DESCRIPTION OF THE EXEMPLARY EMBODIMENTS

Embodiments of the present invention will be described hereinbelow with reference to the drawings. In the description, the same components are given the same reference signs, and descriptions of components described once will be omitted as appropriate.

Configuration of Pressure Sensor

Figure 1:
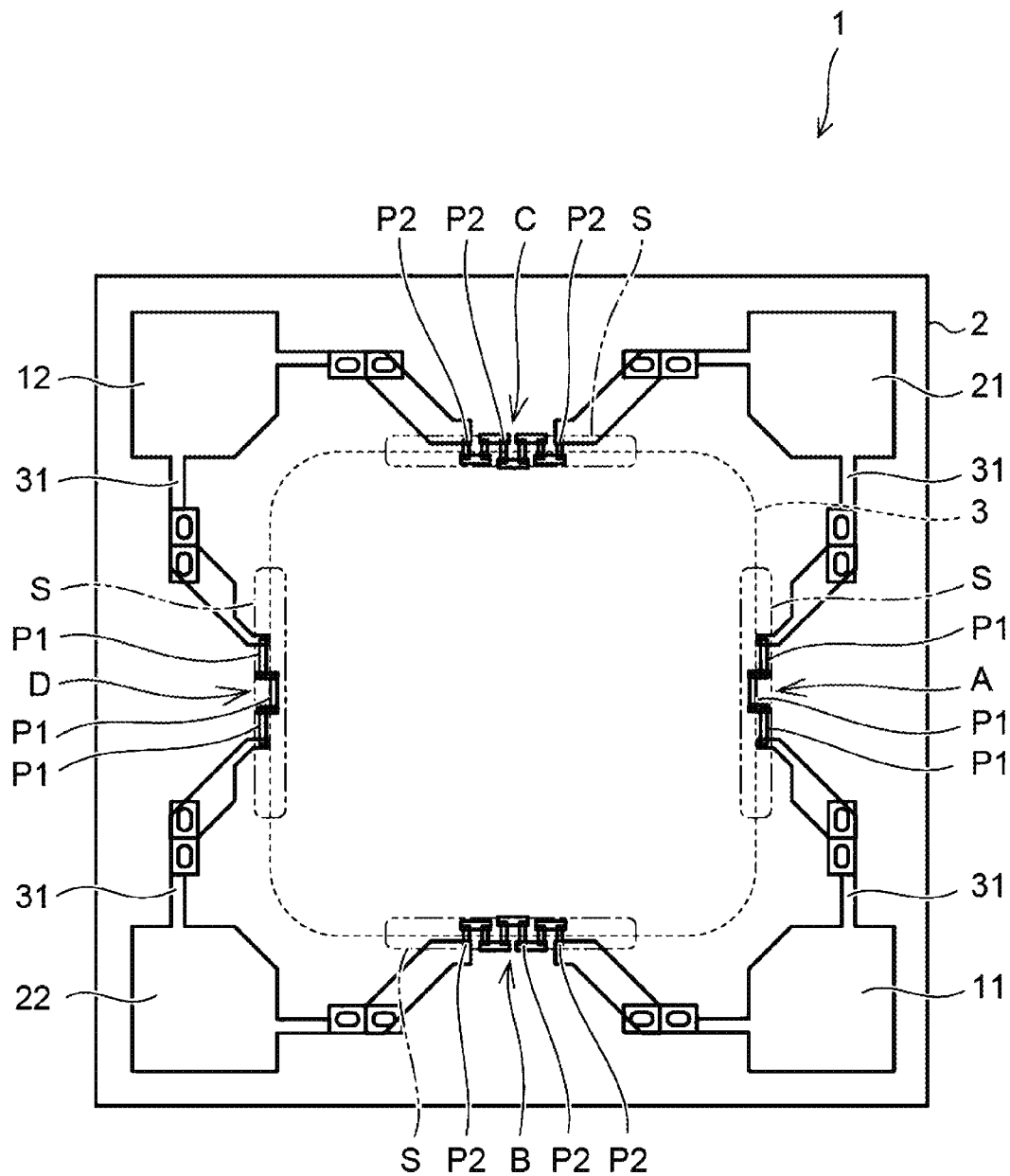
FIG. 1 is a plan view of a pressure sensor according to an embodiment.

FIG. 1 is a plan view of a pressure sensor according to an embodiment.

Figure 2A:
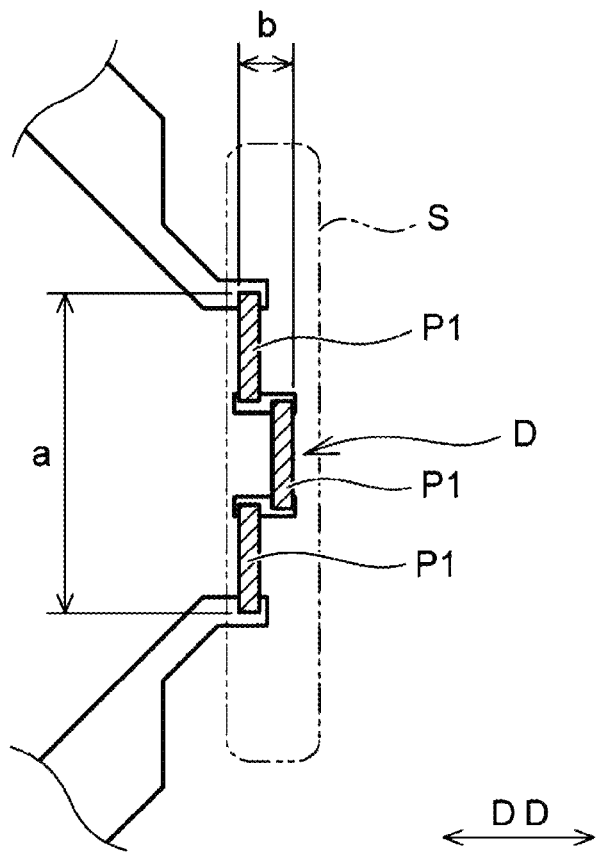
FIGS. 2A and 2B are plan views of the configurations of piezoelectric element areas.
Figure 2B:
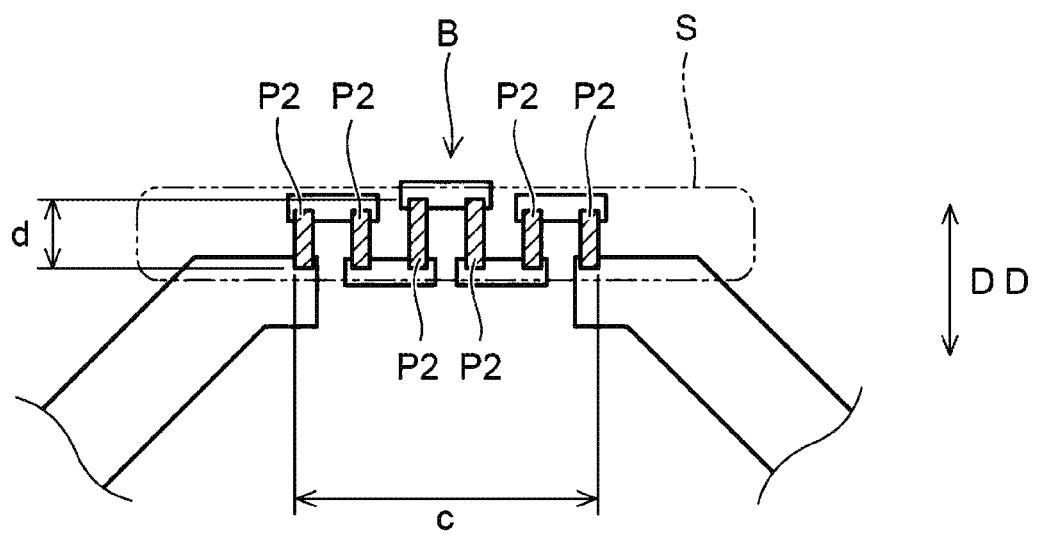

FIGS. 2A and 2B are plan views of the configurations of piezoelectric element areas.

Figure 3:
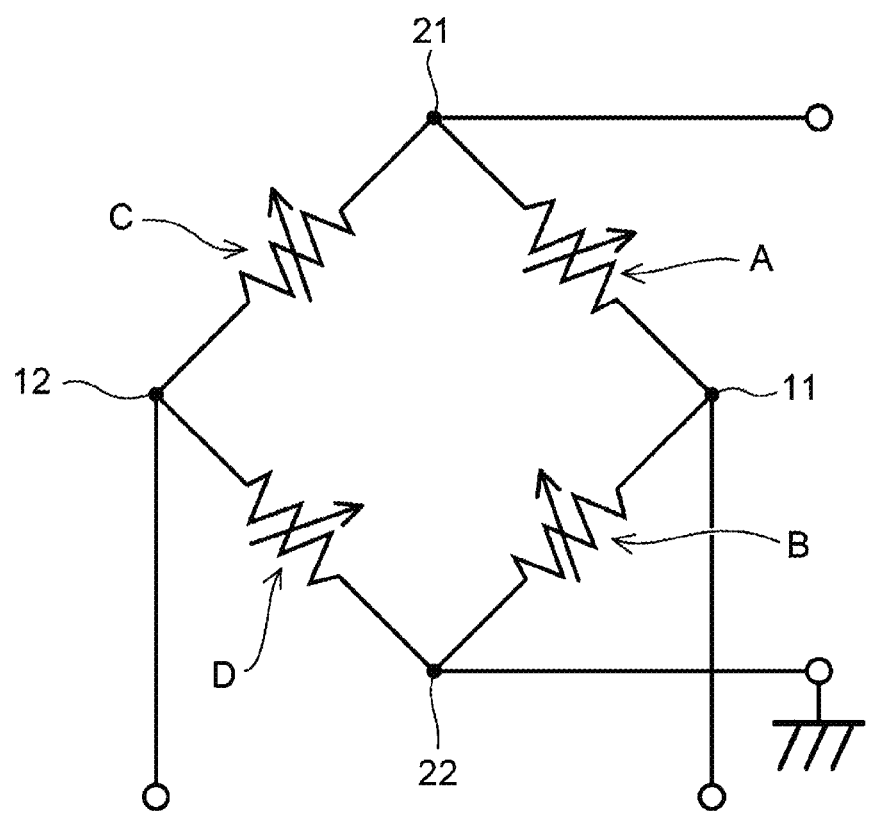
FIG. 3 is a circuit configuration diagram of the pressure sensor of this embodiment.

FIG. 3 is a circuit configuration diagram of the pressure sensor of this embodiment.

As shown in FIG. 1, the pressure sensor 1 according to this embodiment includes a diaphragm 3 provided on a silicon substrate 2 and a plurality of piezoelectric element areas A to D of which the resistance values change according to the distortion of the diaphragm 3.

An example of the silicon substrate 2 is a silicon-on-insulator (SOI) substrate. The SOI substrate has a configuration in which a first silicon substrate and a second silicon substrate are laminated with, an oxidation layer (for example, $SiO_2$) sandwiched therebetween. For example, if the first silicon substrate is on the upper side, and the second silicon substrate is on the lower side, a cavity (recess) is formed in in the second silicon substrate, and the oxidation layer on the cavity and the first silicon substrate form the diaphragm 3. FIG. 1 shows the area of the diaphragm 3 with a broken line.

The diaphragm 3 may have a substantially quadrangular shape with four sides in plan view. The substantial quadrangle includes a rectangle with slightly round corners and a rectangle chamfered diagonally at the corners.

In this embodiment, the plurality of piezoelectric element areas A to D are a first piezoelectric element area A, a second piezoelectric element area B, a third piezoelectric element area C, and a fourth piezoelectric element area D. The piezoelectric element areas A to D here are circumscribed rectangular areas including a plurality of piezoelectric elements P1 and P2, described later.

The first piezoelectric element area A and the second piezoelectric element area B are connected in series via a first output terminal 11. The third piezoelectric element area C and the fourth piezoelectric element area D are connected in series via a second output terminal 12. The first piezoelectric element area A and the third piezoelectric element area C are connected via an input terminal 21. The second piezoelectric element area B and the fourth piezoelectric element area D are connected via a grounding terminal 22.

The first piezoelectric element area A, the second piezoelectric element area B, the third piezoelectric element area C, and the fourth piezoelectric element area D constitute the full bridge circuit shown in FIG. 3. In other words, the characteristics of the first piezoelectric element area A and the characteristics of the fourth piezoelectric element area D are equal, the characteristics of the second piezoelectric element area B and the characteristics of the third piezoelectric element area C are equal, and the characteristics of the first piezoelectric element area A and the characteristics of the second piezoelectric element area B differ.

In the case where the diaphragm 3 is substantially quadrangular in plan view, the first piezoelectric element area A and the fourth piezoelectric element area D are disposed at about the center of each of the opposing two sides of the diaphragm 3, and the second piezoelectric element area B and the third piezoelectric element area C are disposed at about the center of each of the other two opposing sides of the diaphragm 3 in a plan view of the diaphragm 3.

The first output terminal 11, the second output terminal 12, the input terminal 21, and the grounding terminal 22 are provided in the area of the silicon substrate 2 outside the diaphragm 3. The first output terminal 11, the second output terminal 12, the input terminal 21, and the grounding terminal 22 are each provided with a connecting wire 31 and are electrically connected to the piezoelectric element areas A to D through the connecting wires 31, respectively.

When the diaphragm 3 is subjected to pressure and is distorted (displaced), the resistance values of the first piezoelectric element area A, the second piezoelectric element area B, the third piezoelectric element area C, and the fourth piezoelectric element area D change according to the distortion, and the midpoint potential of the bridge circuit formed of the four piezoelectric element areas A to D changes.

The displacement of the diaphragm 3 when subjected to pressure acts in the compressing direction on the pair of first piezoelectric element area A and the fourth piezoelectric element area D so as to decrease the resistance and acts in the tensile direction on the opposing pair of second piezoelectric element area B and the third piezoelectric element area C to increase the resistance.

Thus, the midpoint potential that changes according to the resistance which changes depending on to the forces in the compressing direction and the tensile direction that act on the first piezoelectric element area A, the second piezoelectric element area B, the third piezoelectric element area C, and the fourth piezoelectric element area D, respectively, is the output from the pressure sensor 1.

In the pressure sensor 1 of this embodiment, the first piezoelectric element area A, the second piezoelectric element area B, the third piezoelectric element area C, and the fourth piezoelectric element area D are each disposed in a maximum deflection area S of the diaphragm 3. The maximum deflection area S of the diaphragm 3 is an area in which the deflection is 80% or more of the maximum stress on the diaphragm 3 when the diaphragm 3 is deflected under a predetermined pressure.

The disposition of each of the first piezoelectric element area A, the second piezoelectric element area B, the third piezoelectric element area C, and the fourth piezoelectric element area D in the maximum deflection area S of the diaphragm 3 allows the stress due to the distortion of the diaphragm 3 to be received by the piezoelectric element areas A to D sufficiently and evenly.

In other words, the maximum deflection areas S of the diaphragm 3 are subjected to a stress of 80% or more of the maximum stress when the diaphragm 3 is distorted. The disposition of the piezoelectric element areas A to D in the maximum deflection areas S allows the stress to be applied to all over the piezoelectric element areas A to D intensively. This reduces higher-order nonlinear components in the output of the pressure sensor 1 to maximize the output voltage of the bridge circuit without changing the overall configuration (the size, thickness, and so on of the diaphragm 3).

Configuration of Piezoelectric Element Area

Next, the configurations of the piezoelectric element areas will be described.

FIG. 2A illustrates the configuration of the fourth piezoelectric element area D. The first piezoelectric element area A is symmetrical in shape to the fourth piezoelectric element area D. For that reason, the description is made based on the fourth piezoelectric element area D.

The fourth piezoelectric element area D may include a plurality of piezoelectric elements P1. In this embodiment, three piezoelectric elements P1 may be connected in meander shape. Each piezoelectric element P1 may be rectangular in plan view, in which the deflecting direction of the diaphragm 3 (the direction perpendicular to the sides of the diaphragm 3) DD is the lateral direction, and the direction perpendicular to the deflecting direction DD is the longitudinal direction. This allows the piezoelectric elements P1 in the fourth piezoelectric element area D to act so as to receive compression stress due to the distortion of the diaphragm 3 to decrease in resistance. All of the three piezoelectric elements P1 are disposed in the maximum deflection area S.

FIG. 2B illustrates the configuration of the second piezoelectric element area B. The third piezoelectric element area C is symmetrical in shape to the second piezoelectric element area B. For that reason, the description is made based on the second piezoelectric element area B.

The second piezoelectric element area B includes a plurality of piezoelectric elements P2. In this embodiment, five piezoelectric elements P2 may be connected in meander shape. Each piezoelectric element P2 is rectangular in plan view, in which the deflecting direction DD of the diaphragm 3 is the longitudinal direction, and the direction perpendicular to the deflecting direction DD is the lateral direction. This allows the piezoelectric elements P2 in the second piezoelectric element area B to act so as to receive tensile stress due to the distortion of the diaphragm 3 to increase in resistance. All of the five piezoelectric elements P2 are disposed in the maximum deflection area S.

These areas (circumscribed rectangular areas) preferably have similar figures to increase the similarity between the output of the pair of the first piezoelectric element area A and the fourth piezoelectric element area D and the output of the pair of the second piezoelectric element area B and the third piezoelectric element area C. In other words, both of a≈c and b≈d are satisfied, where a is the longitudinal length of the fourth piezoelectric element area D (the first piezoelectric element area A), b is the lateral length of the fourth piezoelectric element area D, c is the longitudinal length of the second piezoelectric element area B (the third piezoelectric element area C), and d is the lateral length of the second piezoelectric element area B. In other words, a/b and c/d are almost equal.

Furthermore, a/b and c/d may be set to about 2 or greater and 10 or less, preferably, about 6. Furthermore, a and c are preferably greater than 0 and about one fifth or less of the length of one side of the diaphragm 3, and more preferably, one sixth or greater and one fifth or less. The piezoelectric element areas (the first piezoelectric element area A to the fourth piezoelectric element area D) in which piezoelectric elements are disposed are absolutely necessary to measure the deformation or deflection of the diaphragm 3 according to the pressure. However, excessively large piezoelectric element areas may exert significant influence on the degree of deformation of the diaphragm 3, which may affect the measurement result, for example, decrease the sensitivity. For this reason, setting the piezoelectric element areas (the first piezoelectric element area A to the fourth piezoelectric element area D) to about one fifth or less of the length of one side of the diaphragm 3 allows the influence of the piezoelectric element areas on the deformation (deflection) of the diaphragm 3 to be reduced appropriately. This therefore allows each of the piezoelectric element areas A to D to be laid out in the maximum deflection area S while keeping the distortion resistance characteristics of the piezoelectric element areas A to D, improving the sensitivity of the pressure sensor 1.

Although the fourth piezoelectric element area D (the first piezoelectric element area A) and the second piezoelectric element area B (the third piezoelectric element area C) are similar areas, the longitudinal direction of the fourth piezoelectric element area D (the first piezoelectric element area A) and the longitudinal direction of the second piezoelectric element area B (the third piezoelectric element area C) may differ from each other by 90 degrees. In contrast, the longitudinal direction of the piezoelectric elements P1 in the fourth piezoelectric element area D (the first piezoelectric element area A) and the longitudinal direction of the piezoelectric elements P2 in the second piezoelectric element area B (the third piezoelectric element area C) may be aligned with each other.

Thus, the plurality of piezoelectric elements P1 and P2 whose longitudinal direction are the same are disposed in the piezoelectric element areas A and D and the piezoelectric element areas B and C, which 90 degrees differ in orientation, so as to be equal in total area. For that reason, the number of the piezoelectric elements P1 in the fourth piezoelectric element area D (the first piezoelectric element area A) and the number of the piezoelectric elements P2 in the second piezoelectric element area B (the third piezoelectric element area C) may differ from each other. Thus, the plurality of piezoelectric elements P1 and P2 in the piezoelectric element areas A to D can be laid out in the maximum deflection areas S.

The shape of the piezoelectric elements P1 in the fourth piezoelectric element area D (the first piezoelectric element area A) and the shape of the piezoelectric elements P2 in the second piezoelectric element area B (the third piezoelectric element area C) may differ from each other. This allows the plurality of piezoelectric elements P1 and P2 to be laid out in the maximum deflection areas S while keeping the distortion resistance characteristics of the piezoelectric element areas A to D.

Stress Distribution of Diaphragm

Figure 4A:
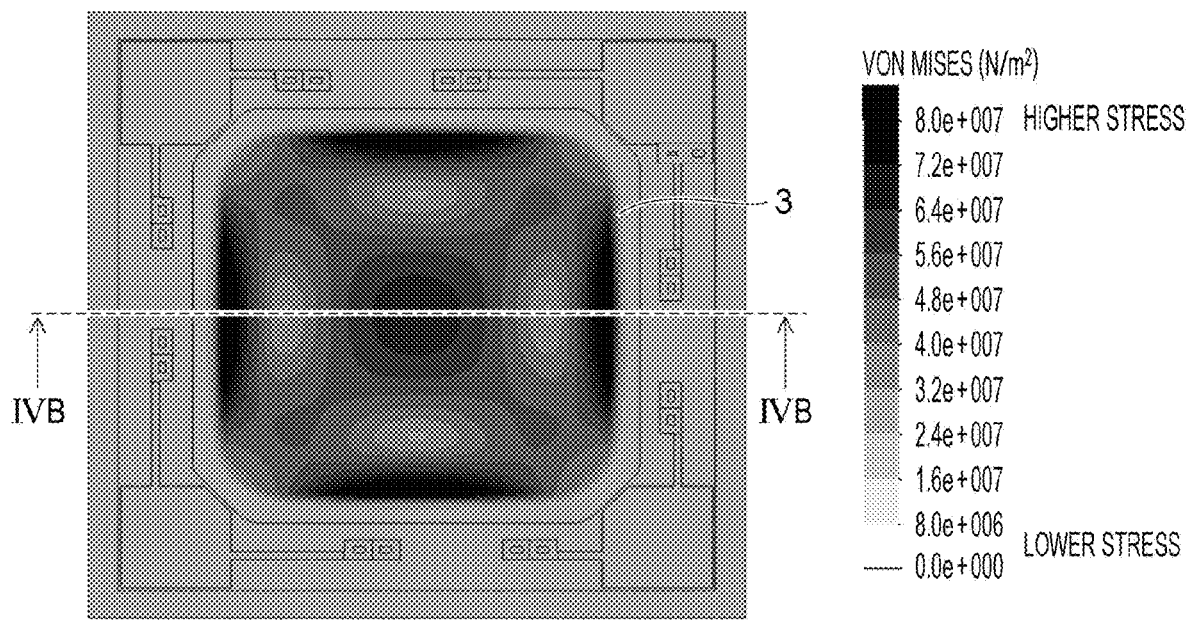
FIGS. 4A and 4B are diagrams showing the stress distribution of a diaphragm.
Figure 4B:
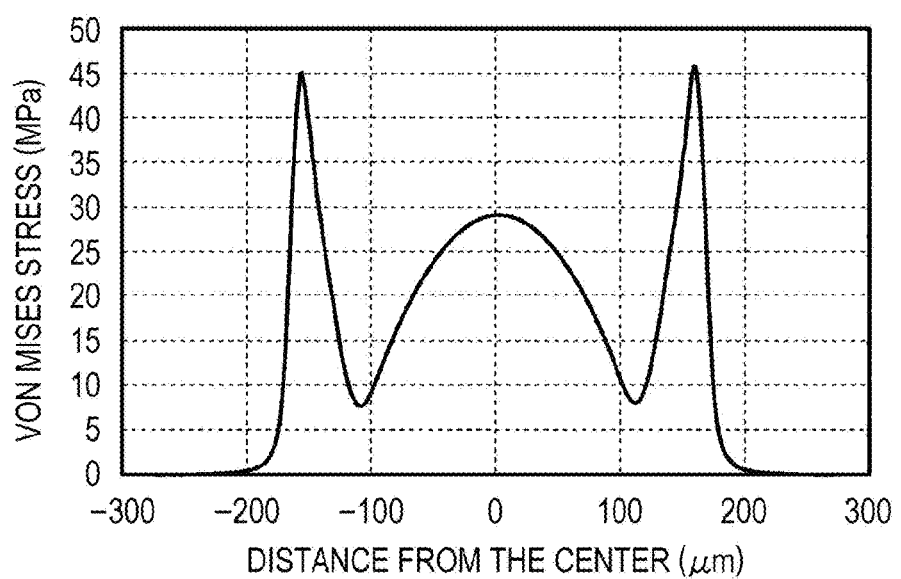
Figure 5A:
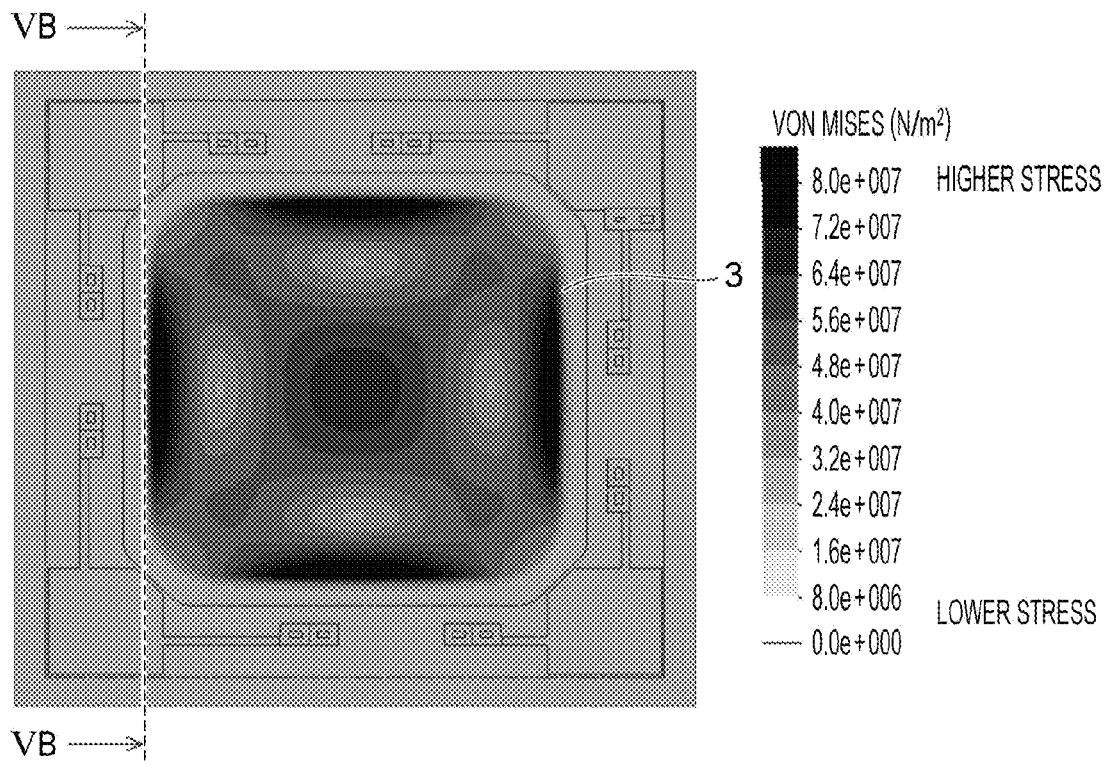
FIGS. 5A and 5B are diagrams showing the stress distribution of a diaphragm.
Figure 5B:
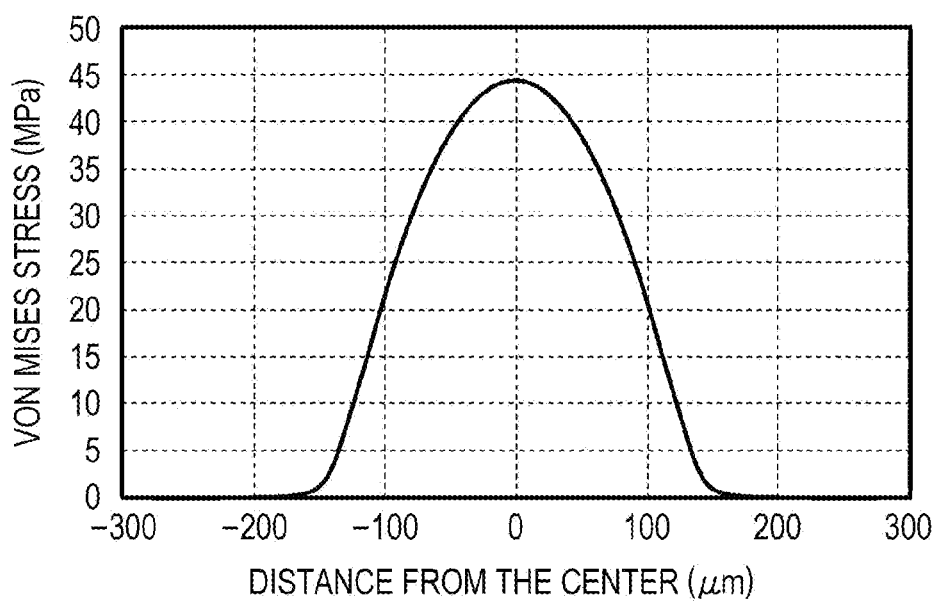

FIG. 4A to FIG. 5B show the stress distribution of the diaphragm. FIG. 4A and FIG. 5A show the stress distribution of the diaphragm 3 in plan view. FIG. 4B shows a stress distribution taken along line IVB-IVB in FIG. 4A. FIG. 5B shows a stress distribution taken along line VB-VB in FIG. 5A.

As shown in FIGS. 4A and 4B, the stress distribution along a line passing through the center of the substantially quadrangular diaphragm 3 is highest in the vicinity of the sides and is also high at the center. As shown in FIGS. 5A and 5B, the stress distribution along a side of the substantially quadrangular diaphragm is highest at the center and decreases toward the corners.

The piezoelectric element areas A to D are disposed in the maximum deflection areas S that are subjected to a stress of 80% or more of the maximum stress of the diaphragm 3 so as to receive the stress when the diaphragm 3 is distorted. In the examples shown in FIG. 4 and FIG. 5, the maximum stress is 45 Mpa. For that reason, areas of 36 Mpa or more, which is 80% or more of the maximum stress, are the maximum deflection areas S. In this example, the longitudinal length of the maximum deflection areas S is about 119 µm, and the lateral length is about 10 µm. The plurality of piezoelectric elements P1 and P2 are disposed in the maximum deflection areas S of this size.

Nonlinearity of Diaphragm

The stress of the diaphragm 3 has a nonlinear distribution in which the center of each side is higher than the ends of the side. The change in the resistance of the upper and lower piezoelectric element areas and the change in the resistance of the right and left piezoelectric element areas exhibit different characteristics unless the positional relationship and the directions with respect to the sides of the diaphragm 3 are symmetrical. This results in generation of complicated higher-order components in the pressure nonlinearity.

In the pressure sensor 1 according to this embodiment, the first piezoelectric element area A to the fourth piezoelectric element area D are disposed in the maximum deflection areas S of the diaphragm 3. The structure of this embodiment in which the upper and lower piezoresistive elements and the right and left piezoresistive elements are optimized for the respective stress distributions offsets the resistance change effect, allowing reducing the higher-order components with linearity characteristics of the pressure characteristics.

The optimum arrangement of the piezoelectric element areas A to D in the maximum deflection areas S in which stress distribution changes concentrate is effective also in maximizing the output voltage of the sensor bridge circuit.

Figure 6A:
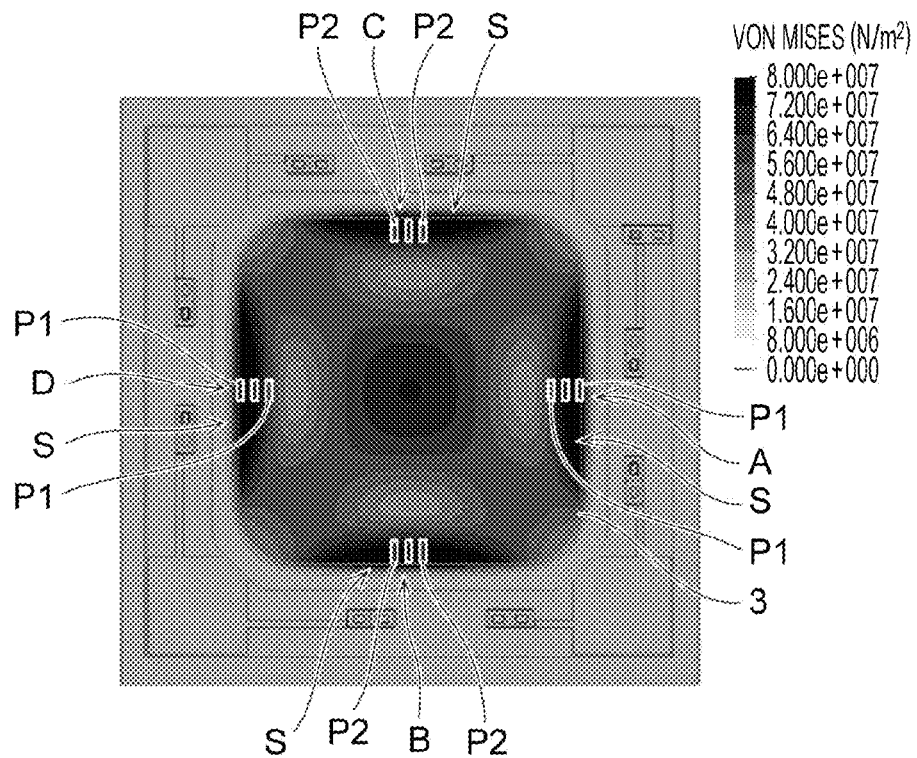
FIGS. 6A and 6B are diagrams showing the nonlinearity of the output of a pressure sensor using a substantially quadrangular diaphragm, to which this embodiment is not applied.
Figure 6B:
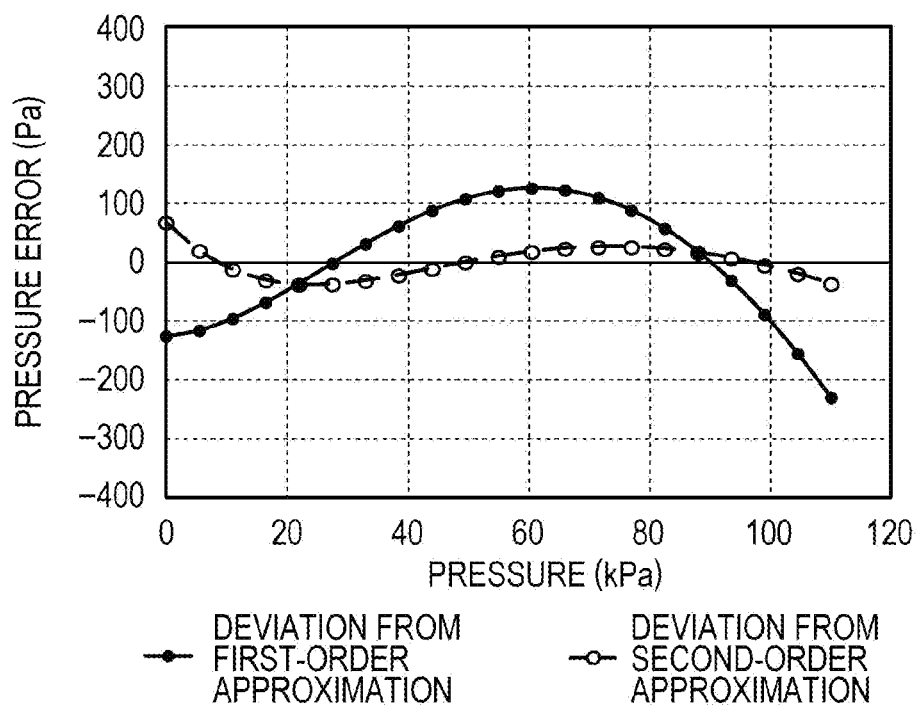

FIGS. 6A and 6B are diagrams showing the nonlinearity of the output of a pressure sensor using a substantially quadrangular diaphragm, to which this embodiment is not applied. FIG. 6A shows the arrangement of the piezoelectric element areas A to D in the substantially quadrangular diaphragm 3. FIG. 6B shows nonlinearity of the pressure error (deviation from first-order approximation and deviation from second-order approximation). In the pressure sensor shown in FIG. 6A, some of the piezoelectric element areas A to D are disposed out of the maximum deflection areas S.

In the pressure sensor in which some of the piezoelectric element areas A to D are disposed out of the maximum deflection areas S, the deviation of the pressure error from first-order approximation is like a corrupt cubic function, and the deviation from the second-order approximation also has an error of about 70 Pa, as shown in FIG. 6B. The more the pressure error contain higher-order components, the more difficult the correction using a correcting circuit, which tends to cause a decrease in measurement accuracy.

Figure 7A:
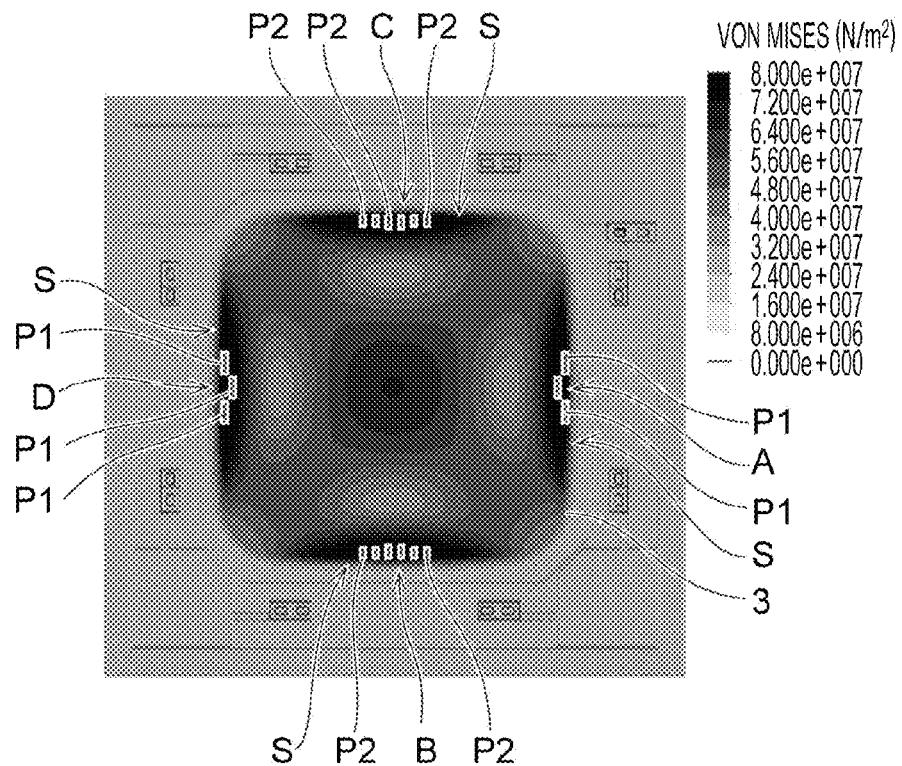
FIGS. 7A and 7B are diagrams showing the nonlinearity of the output of a pressure sensor using a substantially quadrangular diaphragm, to which this embodiment is applied.
Figure 7B:
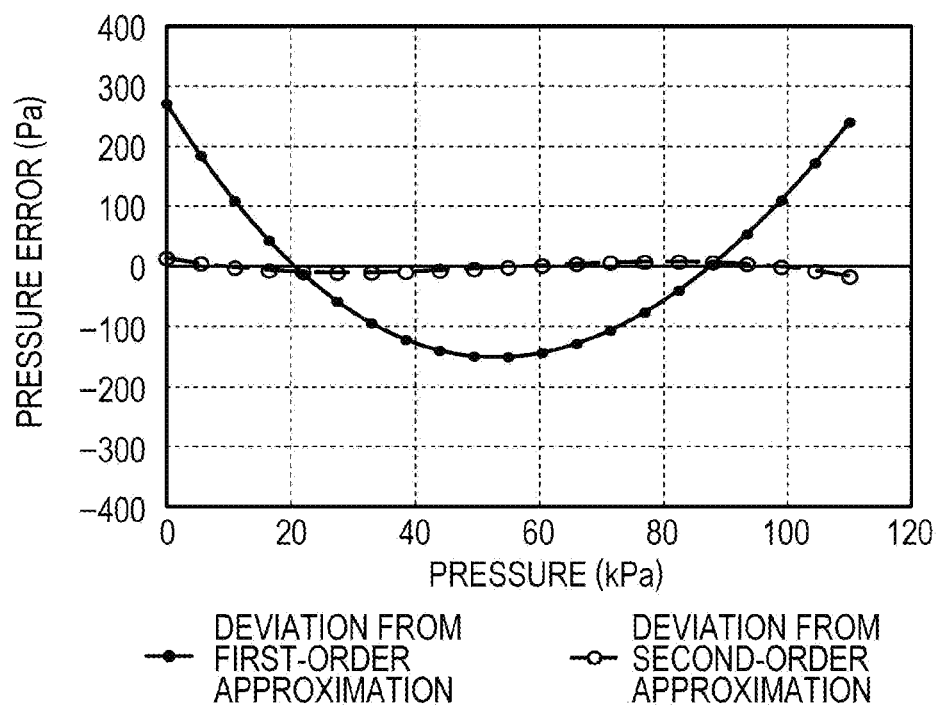

FIGS. 7A and 7B are diagrams showing the nonlinearity of the output of a pressure sensor using a substantially quadrangular diaphragm, to which this embodiment is applied. FIG. 7A shows the arrangement of the piezoelectric element areas A to D in the substantially quadrangular diaphragm 3. FIG. 7B shows nonlinearity of the pressure error (deviation from first-order approximation and deviation from second-order approximation). In the pressure sensor shown in FIG. 7A, the piezoelectric element areas A to D are disposed in the maximum deflection areas S.

In the pressure sensor in which the piezoelectric element areas A to D are disposed in the maximum deflection areas S, the deviation from the second-order approximation is very small (about 16 Pa), as shown in FIG. 7B. The deviation from the first-order approximation is like a quadratic curve. This is because higher-order error components are decreased. The decrease in higher-order error components improves the correction accuracy using a correcting circuit, allowing for improving the measurement accuracy. In the viewpoint of correction accuracy using a correcting circuit, the pressure error is small most preferably on the basis of first-order approximation, next preferably on the basis of second-order approximation, and next preferably on the basis of third-order approximation. Among them, the correcting circuit is configured for approximation that can minimize the measurement error.

Example of Another Shape of Diaphragm

Figure 8A:
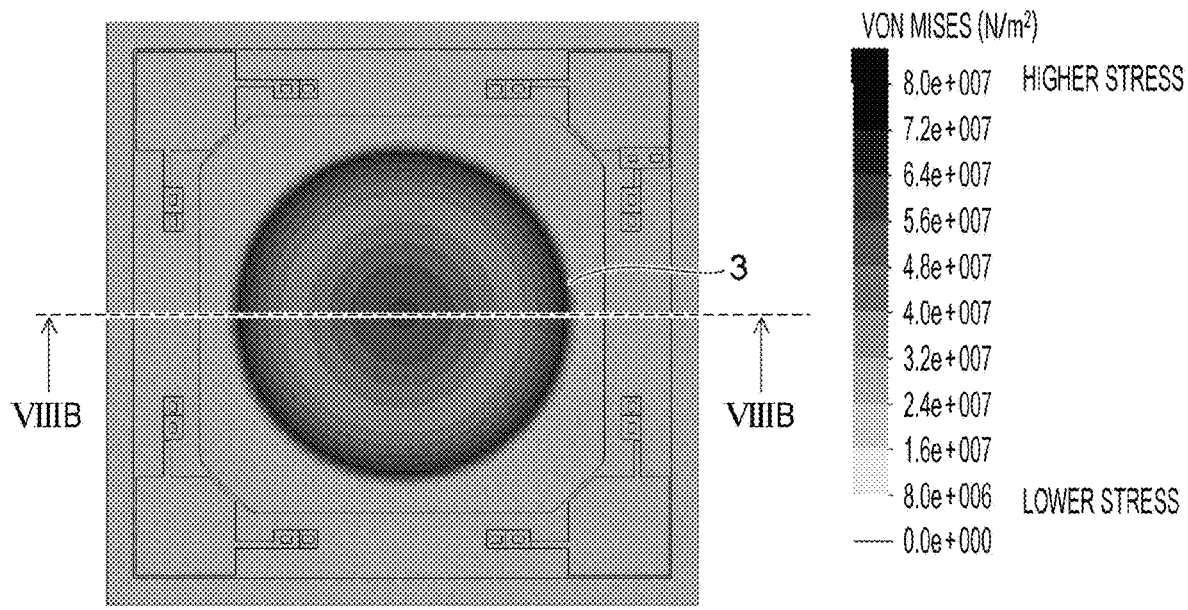
FIGS. 8A and 8B are diagrams show the stress distribution of a circular diaphragm.
Figure 8B:
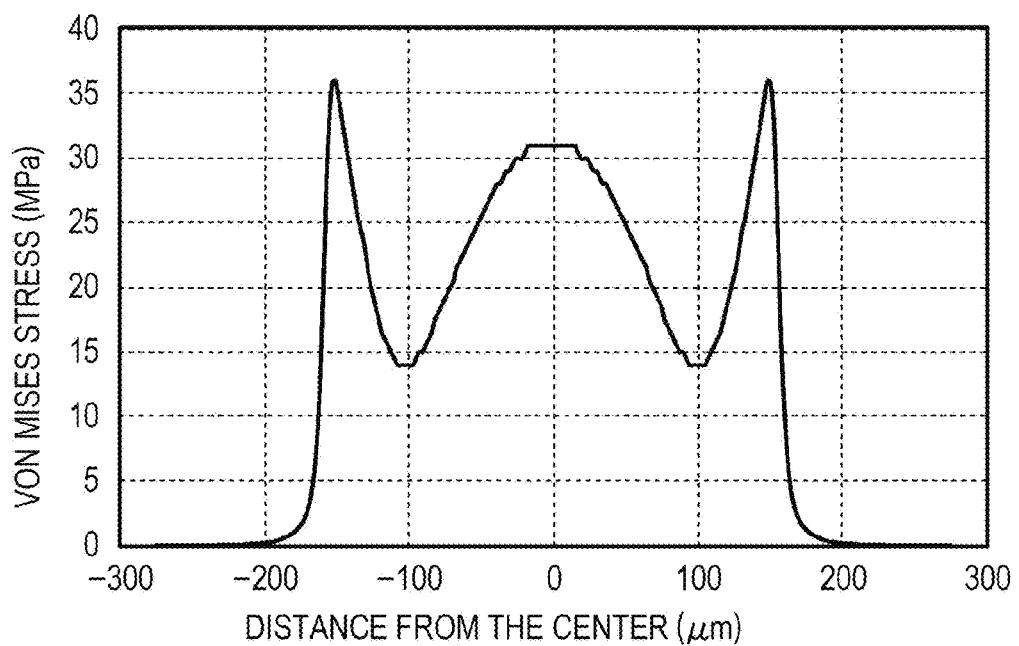

FIGS. 8A and 8B show the stress distribution of a circular diaphragm. FIG. 8A shows the stress distribution of the diaphragm 3 in plan view. FIG. 8B shows the stress distribution taken along line VIIIB-VIIIB in FIG. 8A.

As shown in FIGS. 8A and 8B, the stress distribution of the circular diaphragm 3 at the position along the line passing through the center is highest at the boundary (ends) of the diaphragm 3 and is also high at the center. The circular diaphragm 3 exhibits similar stress distribution on any line passing through the center. The area of 80% or more of the maximum stress in the circular diaphragm 3 includes the area along the boundary of the diaphragm 3 and part of the central portion of the diaphragm 3. However, the maximum deflection area S in this case is an area of 80% or more of the maximum stress and including the maximum stress. The maximum deflection area S of the circular diaphragm 3 is therefore the doughnut-shaped area along the boundary of the diaphragm 3.

In the example shown in FIG. 8, the maximum stress is 36 Mpa. Accordingly, of the area of 28.8 Mpa or more, which is 80% or more of the maximum stress, the doughnut-shaped area along the boundary of the diaphragm 3 is the maximum deflection area S. In this example, the width (radial length) of the maximum deflection area S is about 17.2 μm. The plurality of piezoelectric elements P1 and P2 are disposed in the maximum deflection area S of this size.

Nonlinearity of Diaphragm

Figure 9A:
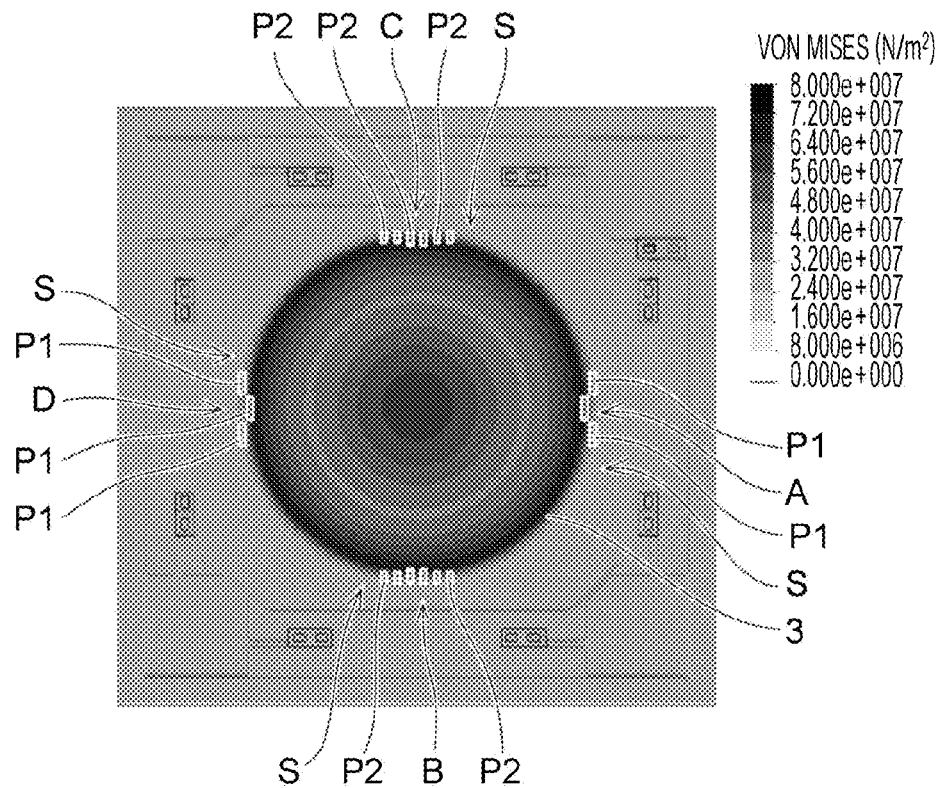
FIGS. 9A and 9B are diagrams showing the nonlinearity of the output of a pressure sensor using a circular diaphragm, to which this embodiment is applied.
Figure 9B:
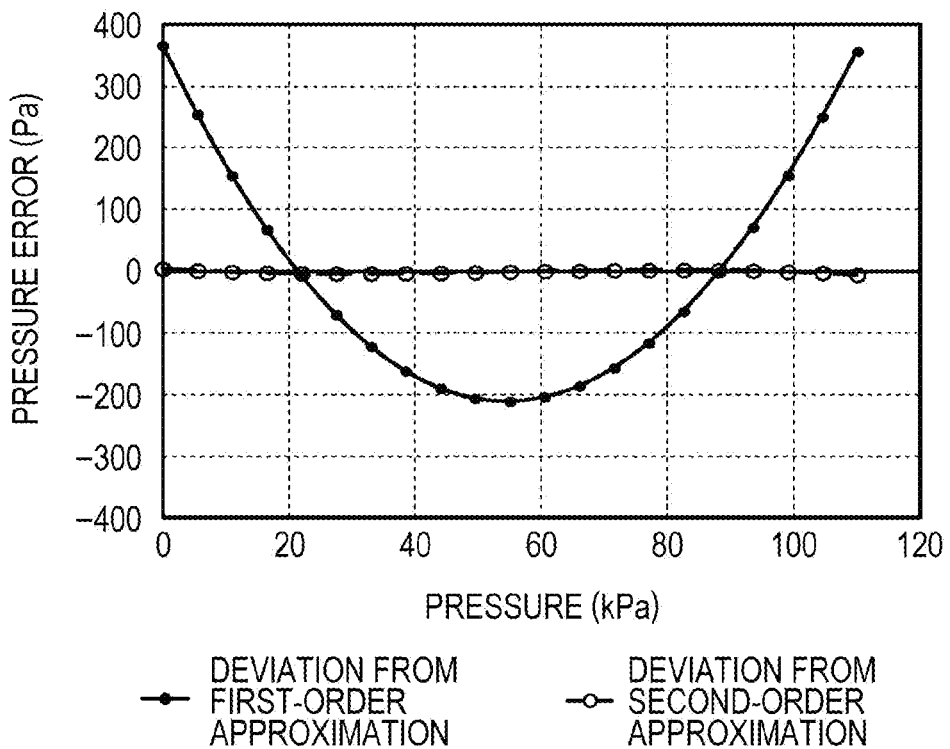

FIGS. 9A and 9B are diagrams showing the nonlinearity of the output of a pressure sensor using a circular diaphragm, to which this embodiment is applied. FIG. 9A shows the arrangement of the piezoelectric element areas A to D in the circular diaphragm 3. FIG. 9B shows nonlinearity of the pressure error (deviation from first-order approximation and deviation from second-order approximation). In the pressure sensor shown in FIG. 9A, the piezoelectric element areas A to D are disposed in the maximum deflection area S. The shapes of the piezoelectric element areas A to D are the same as the shapes of the piezoelectric element areas A to D disposed at the substantially quadrangular diaphragm 3 shown in FIG. 7A.

In the pressure sensor in which the piezoelectric element areas A to D are disposed in the maximum deflection area S of the circular diaphragm 3, the deviation from the second-order approximation is very small (about 5 Pa), as shown in FIG. 9B. The deviation from the first-order approximation is like a quadratic curve. This makes the correction with the correcting circuit easy, allowing the measurement accuracy to be increased.

Figure 10A:
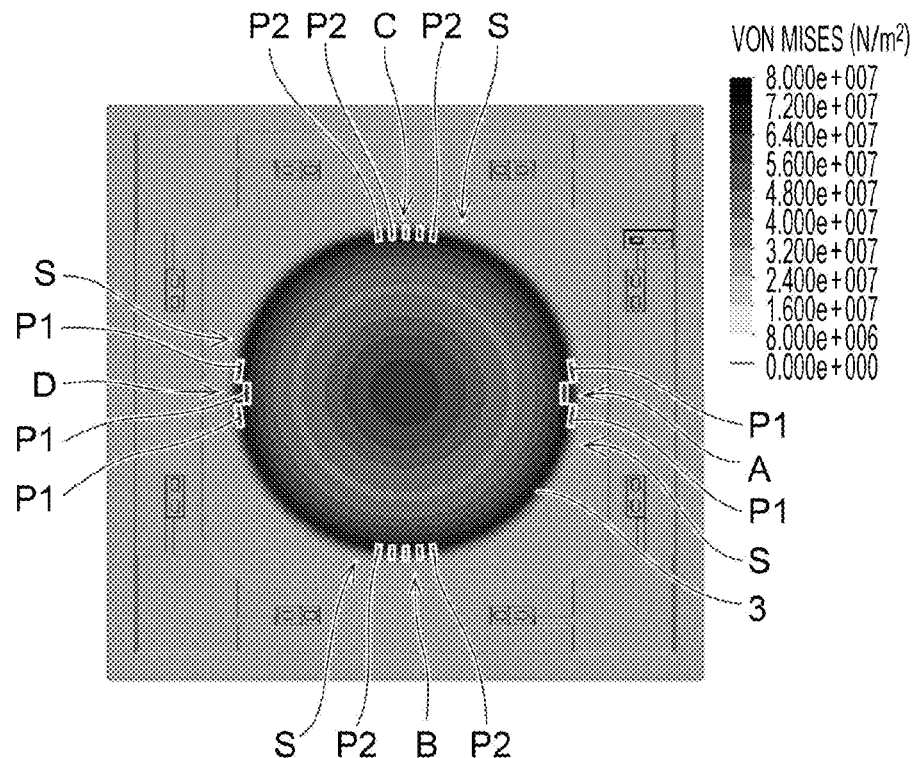
FIGS. 10A and 10B are diagrams showing the nonlinearity of the output of a pressure sensor using a circular diaphragm, to which another example of the present embodiment is applied.
Figure 10B:
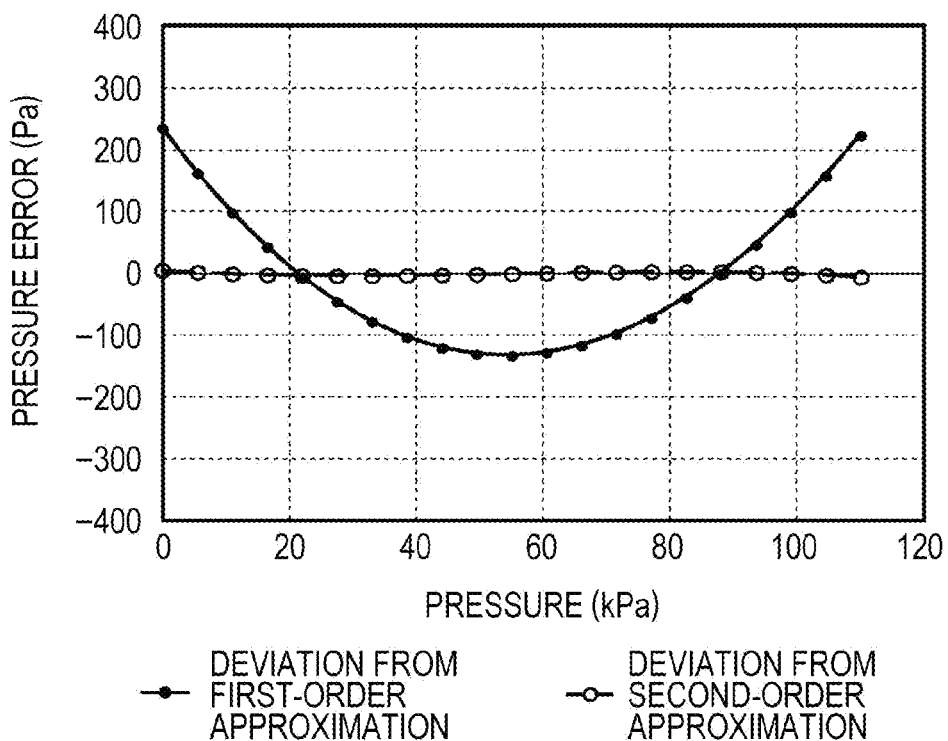

FIGS. 10A and 10B are diagrams showing the nonlinearity of the output of a pressure sensor using a circular diaphragm, to which another example of the present embodiment is applied. FIG. 10A shows the arrangement of the piezoelectric element areas A to D in the circular diaphragm 3. FIG. 10B shows nonlinearity of the pressure error (deviation from first-order approximation and deviation from second-order approximation). In the pressure sensor shown in FIG. 10A, the piezoelectric element areas A to D are disposed in the maximum deflection area S, and each of the piezoelectric element areas A to D is shaped like a fan along the circumference of the circular diaphragm 3.

The pressure sensor in which the piezoelectric element areas A to D are disposed in the maximum deflection area S of the circular diaphragm 3 and in which each of the piezoelectric element areas A to D is shaped like a fan along the circumference of the circular diaphragm 3, as described above, shows a very small deviation (about 5 Pa) from the second-order approximation, as shown in FIG. 10B. Furthermore, the deviation from the first-order approximation is like a quadratic curve. This makes the correction with the correcting circuit easy, allowing the measurement accuracy to be increased. Furthermore, the deviation from the first-order approximation is smaller than that of the pressure sensor shown in FIG. 9. This shows that the pressure sensor shown in FIG. 10 is optimized as compared with the pressure sensor shown in FIG. 9.

Those embodiments allow the pressure sensor 1 using the diaphragm 3 and piezoelectric elements to obtain high output with high accuracy, as described above.

Although the embodiments have been described above, the present invention is not limited to the above examples. For example, although the substantially quadrangular diaphragm 3 has been described, a polygonal diaphragm other than the substantially quadrangular diaphragm may be used. The plurality of piezoelectric element areas may be disposed not only on axes crossing at right angles at the center of the diaphragm 3 but also on axes crossing (not at right angles) at the center of the diaphragm 3. It is to be understood that addition or deletion of components and design changes to the embodiments, and a combination of the features of the configuration examples of the embodiments are also included in the scope of the present invention as fall within the spirit of the present invention.

What is claimed is:

1. A pressure sensor comprising:
   a diaphragm on a substrate; and
   a plurality of piezoelectric element areas that change in resistance according to distortion of the diaphragm,
   wherein the plurality of piezoelectric element areas include a first piezoelectric element area, a second piezoelectric element area, a third piezoelectric element area, and a fourth piezoelectric element area,
   wherein the first piezoelectric element area and the second piezoelectric element area are connected in series via a first output terminal, the third piezoelectric element area and the fourth piezoelectric element area are connected in series via a second output terminal, the first piezoelectric element area and the third piezoelectric element area are connected via an input terminal, the second piezoelectric element area and the fourth piezoelectric element area are connected via a grounding terminal, and the first piezoelectric element area to the fourth piezoelectric element area constitute a full bridge circuit, wherein, when the diaphragm is distorted, the resistance of the second piezoelectric element area and the third piezoelectric element area increases, and the resistance of the first piezoelectric element area and the fourth piezoelectric element area decreases,
   wherein the diaphragm has a maximum deflection area whose stress becomes 80% or more of a maximum stress when distorted by a predetermined pressure, and
   wherein the first piezoelectric element area, the second piezoelectric element area, the third piezoelectric element area, and the fourth piezoelectric element area are disposed in the maximum deflection area.

2. The pressure sensor according to claim 1, wherein the first piezoelectric element area, the second piezoelectric element area, the third piezoelectric element area, and the fourth piezoelectric element area each have a longitudinal length of about two times or more and ten times or less of a lateral length.

3. The pressure sensor according to claim 1,
   wherein each of the first piezoelectric element area, the second piezoelectric element area, the third piezoelectric element area, and the fourth piezoelectric element area includes a plurality of piezoelectric elements,
   wherein, in plan view of the diaphragm, the first piezoelectric element area and the fourth piezoelectric element area are opposed to each other, and the second piezoelectric element area and the third piezoelectric element area are opposed to each other,
   wherein a longitudinal direction of the piezoelectric elements in the first piezoelectric element area and the fourth piezoelectric element area is oriented in a direction perpendicular to a direction in which the diaphragm is deflected, and
   wherein a longitudinal direction of the piezoelectric elements in the second piezoelectric element area and the third piezoelectric element area is oriented in the direction in which the diaphragm is deflected.

4. The pressure sensor according to claim 3,
   wherein the diaphragm is a substantially quadrangle having four sides in plan view, and
   wherein, in plan view of the diaphragm, the first piezoelectric element area and the fourth piezoelectric element area are disposed at substantially a center of each of two opposing sides of the diaphragm, and the second piezoelectric element area and the third piezoelectric element area are disposed at substantially a center of each of other two sides of the diaphragm.

5. The pressure sensor according to claim 1,
   wherein each of the first piezoelectric element area, the second piezoelectric element area, the third piezoelectric element area, and the fourth piezoelectric element area includes a plurality of piezoelectric elements, and
   wherein the piezoelectric elements in each of the first piezoelectric element area and the fourth piezoelectric element area differ in shape from the piezoelectric elements in each of the second piezoelectric element area and the third piezoelectric element area.

6. The pressure sensor according to claim 1,
   wherein each of the first piezoelectric element area, the second piezoelectric element area, the third piezoelectric element area, and the fourth piezoelectric element area includes a plurality of piezoelectric elements, and
   wherein the plurality of piezoelectric elements in each of the first piezoelectric element area and the fourth piezoelectric element area differ in number from the plurality of piezoelectric elements in each of the second piezoelectric element area and the third piezoelectric element area.

7. The pressure sensor according to claim 3, wherein the plurality of piezoelectric elements in each of the first piezoelectric element area, the second piezoelectric element area, the third piezoelectric element area, and the fourth piezoelectric element area are connected in meander shape.

8. The pressure sensor according to claim 2, wherein each of the first piezoelectric element area, the second piezoelectric element area, the third piezoelectric element area, and the fourth piezoelectric element area has a longitudinal length of one fifth or less of a length of one side of the diaphragm.

9. The pressure sensor according to claim 8, wherein each of the first piezoelectric element area, the second piezoelectric element area, the third piezoelectric element area, and the fourth piezoelectric element area has a longitudinal length of one sixth or more and one fifth or less of the length of one side of the diaphragm.

10. The pressure sensor according to claim 1, wherein the substrate comprises a silicon substrate.

\* \* \* \* \*